(12) United States Patent
Zenasni

(10) Patent No.: US 8,637,118 B2
(45) Date of Patent: Jan. 28, 2014

(54) METHOD OF PRODUCTION OF GRAPHENE

(75) Inventor: Aziz Zenasni, Gieres (FR)

(73) Assignee: Commissariat a l'Energie Atomique, Paris (FR)

( * ) Notice: Subject to any disclaimer, the term of this patent is extended or adjusted under 35 U.S.C. 154(b) by 700 days.

(21) Appl. No.: 12/726,888

(22) Filed: Mar. 18, 2010

(65) Prior Publication Data

US 2010/0247801 A1 Sep. 30, 2010

(30) Foreign Application Priority Data

Mar. 25, 2009 (FR) ..................................... 09 51936

(51) Int. Cl.
*C23C 16/26* (2006.01)
(52) U.S. Cl.
USPC ........ 427/249.1; 427/331; 427/532; 427/553; 427/554; 427/558; 427/569; 427/596
(58) Field of Classification Search
USPC .............. 427/249.1, 331, 554, 553, 558, 559, 427/569, 596
See application file for complete search history.

(56) References Cited

U.S. PATENT DOCUMENTS

| | | | |
|---|---|---|---|
| 2007/0137786 A1* | 6/2007 | Luzzi | 156/304.1 |
| 2008/0188383 A1* | 8/2008 | Iseki et al. | 508/107 |

OTHER PUBLICATIONS

Miyamoto et al; Raman-scattering spectroscopy of epitaxial graphene formed on SiC film on Si substrate; e-J. Surf. Sci. Nanotech. vol. 7; published Feb. 21, 2009; pp. 107-109.*
Cappelli et al; Laser annealing of amorphous carbon films; Applied Surface Science 255; available online Oct. 28, 2008; pp. 5620-5625.*
Coraux et al., "Growth of Graphene on Ir(111)", New Journal of Physics, vol. 11, Feb. 4, 2009, pp. 023006-023027, XP002563349.
Scilleta et al., "Influence of Substrate Temperature and Atmosphere on Nano-Graphene Formation and texturing of Pulsed Nd:YAG laser-deposited Carbon Films", Applied Surface Science, vol. 252, No. 13, Apr. 30, 2006, pp. 4877-4881.
Tang et al., "Growth of Graphene Structure on 6H-SiC(0001): Molecular Dynamics Simulation," Journal of Applied Physics, vol. 103, Mar. 17, 2008, pp. 063505-063509, XP-002563350.
Cappelli et al., "Critical Role of Laser Wavelength on Carbon Films Grown by PLD of Graphite", Applied Physics A—Materials Science & Processing, vol. 93, No. 3, Jun. 13, 2008, pp. 751-758, XPO10655820.
Gomez De Arco et al., "Synthesis, Transfer, and Devices of Single- and Few-Layer Graphene by Chemical Vapor Deposition", Research Letters, IEEE Transactions on Nanotechnology, vol. 8 No. 2, Mar. 2009, pp. 135-138, XP-2002563355.

* cited by examiner

*Primary Examiner* — Elizabeth Burkhart
(74) *Attorney, Agent, or Firm* — Miles & Stockbridge P.C.

(57) ABSTRACT

The present invention relates to a method of production of graphene comprising the following stages respectively:
 a stage of deposition of a thin layer comprising amorphous carbon on a substrate;
 a stage of annealing of said thin layer under photonic and/or electronic irradiation, by which a layer comprising graphene is obtained.

12 Claims, No Drawings

METHOD OF PRODUCTION OF GRAPHENE

TECHNICAL FIELD

The present invention relates to a method of production of graphene, notably employing a stage of annealing under irradiation.

Graphene is a two-dimensional crystal in the form of a sheet of carbon, in which the atoms are positioned following a regular order of hexagonal structure, the thickness of this sheet corresponding to that of a carbon atom, thus corresponding to a thickness of less than a nanometre.

Since graphene is in the form of a planar hexagonal lattice, each carbon atom is accordingly bound to three carbon atoms, thus leaving one electron free among the four outer electrons available for chemical bonds. These free electrons can therefore move along the crystal lattice.

Experiments have shown that the electronic properties of graphene are neither those of a metallic conductor nor those of a semiconductor, instead the electrons move as if they have lost their mass—and at a speed close to the speed of light. Furthermore, from a mechanical standpoint, graphene offers exceptional mechanical stiffness.

Thus, even if this material still requires more detailed investigation, that has not prevented the scientific community taking an interest in the potential applications of graphene, among which we may mention:
- the use of graphene in the field of nanoelectronics. In fact, graphene can be used to form a basic electronic component, such as a transistor, because in addition to its nanometric size, it proves stable at room temperature and its electrons can be propagated in a straight line over large distances relative to the atomic scale and at high speed (ballistic transport over micrometric distances). It could thus constitute a candidate of choice for replacing silicon, giving access to devices that are smaller and faster than those obtained with silicon;
- the use of graphene in the field of gas detection. In fact, researchers have found that the movement of the electrons on the surface of graphene, in other words its conductivity, was affected when graphene was in contact with certain gas molecules. Notably, in experiments it was possible to detect one molecule of $NO_2$ in a thousand million, or a thousand times better than the best existing detectors using nanotubes;
- the use of graphene for making other carbon materials such as nanotubes or fullerenes by rolling up graphene sheets;
- the use of graphene for conducting experiments in fundamental physics, notably on a nanometric scale.

PRIOR ART

The production of graphene is still one of the obstacles to its large-scale use for the applications for which it is destined. Currently there are two main methods for the production of graphene.

The first method consists of mechanically extracting a single sheet of graphene from a graphite crystal by micromechanical cleavage. This was employed notably by a "peel-off" method, using simple adhesive tape to pull off pieces of graphite and then deposit them on an insulating substrate, such as a substrate of silicon dioxide ($SiO_2$). The operation is repeated several times. The graphite deposits on the substrate include numerous graphite microcrystals generally formed from several tens or hundreds of layers of graphene. Only a very small fraction comprises isolated sheets of graphene. This method is not suitable for producing a large area of graphene, required for possible use in a chip or other circuits.

A second method consists of starting not from a graphite crystal but from a crystal of silicon carbide (SiC). Thus, by heating silicon carbide (generally produced by epitaxy) for two hours at 1400° C., thus causing evaporation of the silicon, only carbon atoms remain on the surface of the crystal, and they join together spontaneously, forming a hexagonal lattice, and thus forming a graphene/graphite phase.

Whether the first method or the second method is used, large areas of graphene are not obtained (generally graphene sheets of a few $mm^2$ randomly distributed on the sample), thus making its localization on the surface, its manipulation and its extraction difficult. Manipulation can be made possible by transferring layers onto supports other than those that served as a basis for the production of graphene. However, these stages of transfer affect the quality of the layers of graphene.

The inventors' intention was to elaborate a novel method of production of graphene that is easy to apply and notably does not require a stage of transfer of layers of graphene onto supports other than those that were used in the production of said graphene and, furthermore, which makes it possible to obtain graphene over an area identical to that of the substrate that was used as the basis for the production of graphene.

DESCRIPTION OF THE INVENTION

Thus, the invention relates to a method of production of graphene, respectively comprising the following stages:
- a stage of deposition of a layer comprising amorphous carbon on a substrate;
- a stage of annealing of said layer under photonic and/or electronic irradiation, by which a layer comprising graphene is obtained.

Thus, the inventors discovered, surprisingly, that by combining a stage of production of a layer based on amorphous carbon with a special annealing stage, graphene can easily be obtained on the whole surface of the substrate (which makes it possible to obtain graphene sheets with an area equal to that of the underlying substrate) without the subsequent need to transfer the graphene onto other substrates.

Furthermore, this method employs stages that are entirely feasible in an industrial environment, which helps to make this method applicable on an industrial scale.

According to a first stage, the method of the invention comprises a stage of deposition of a layer comprising amorphous carbon on a substrate.

In the sense of the invention, "amorphous carbon" generally means an allotropic form of carbon, optionally hydrogenated (in which case it is abbreviated to the symbol "a:C—H") comprising a mixture of sites with three bonds (carbon in the $sp^2$ hybridization state) and with four bonds (carbon in the $sp^3$ hybridization state), although there is no long-range model of the atomic positions.

The substrate can be of variable dimensions, ranging from a simple tab to a substrate with a length of several centimetres (for example, a substrate with a length of 300 mm), the dimensions selected being those that are required for the graphene.

From the standpoint of its chemical nature, it can be a substrate comprising silicon, such as a substrate of crystalline silicon, a substrate of polysilicon, a substrate of amorphous silicon, a substrate of epitaxial silicon, a substrate of silicon dioxide, a substrate of silicon carbide SiC, a substrate of silicon oxycarbide (designated SiOC), a substrate of silicon nitride, a substrate of silicon carbonitride (designated SiCN), a substrate comprising silicon, oxygen, carbon and fluorine (designated SiOCF), a substrate of silicon boronitride. It can also be a substrate of gallium arsenide (designated GaAs).

Regarding its crystalline nature, it can in particular be a substrate with a unit cell having a specific orientation (100), (110), (111) or (222).

Advantageously, the substrate used within the scope of the method of the invention is a substrate of silicon carbide, preferably grown epitaxially, having a specific orientation of the (111) type.

This stage of deposition can be carried out by vapour deposition or by wet deposition from at least one carbon-containing precursor.

When it is carried out by vapour deposition, it can be a physical deposition in the vapour phase (also designated PVD for Physical Vapour Deposition), a chemical vapour deposition (also designated CVD for Chemical Vapour Deposition), or a deposition in atomic layers (also designated ALD for Atomic Layer Deposition).

When it is carried out by wet deposition, it can be a stage employing the electron-beam evaporation technique, or the spin-coating technique.

In particular, it can be a chemical vapour deposition using a hot filament (known by the acronym HFCVD for Hot Filament Chemical Vapour Deposition), a chemical vapour deposition assisted by UV, a cryogenic chemical vapour deposition, a plasma-enhanced chemical vapour deposition (PECVD).

Preferably, the stage of deposition of the layer comprising amorphous carbon is carried out by plasma-enhanced chemical vapour deposition (PECVD). In particular, in this case, the plasma can be generated by ionization of a gas by means of a microwave, radio-frequency or low-frequency electric discharge. Preferably, the plasma is generated by ionization of a gas by means of a radio-frequency electric discharge, in which case it will be called chemical vapour deposition assisted by radio-frequency plasma. This kind of deposition can be carried out in a plasma reactor of the capacitive type with radio-frequency excitation of 13.56 MHz regardless of the size of the substrate.

In general, plasma-enhanced chemical vapour deposition consists of forming a film on a substrate by chemical reaction of gaseous carbon-containing precursors on the surface of said substrate, these gaseous precursors being derived from carbon-containing precursors required for the formation of amorphous carbon.

Carbon-containing precursors required for formation of the layer comprising amorphous carbon can be linear or cyclic hydrocarbon precursors. They can notably be alkanes, such as methane ($CH_4$), propane ($C_3H_8$) in the form of its various isomers, butane ($C_4H_{10}$) in the form of its various isomers, alkenes, such as propene ($C_3H_6$) in the form of its various isomers, butene ($C_4H_8$) in the form of its various isomers, alkynes such as acetylene ($C_2H_2$), propyne ($C_3H_4$), diene compounds such as butadiene, aromatic compounds such as benzene, toluene and mixtures thereof.

Besides the presence of the aforementioned precursors, the deposition stage can employ carrier gases, in particular inert gases such as Ar, He, Ne, Xe and mixtures thereof, in particular helium.

The quantities determining the characteristics of the plasma can be respectively:
 the frequency that generates the plasma making it possible to influence the ionic bombardment of the substrate, thus permitting modification of the density of the layer, its structure and its rate of formation;
 the power of the plasma, accounting for the degree of dissociation of the species in the gaseous phase;
 the pressure in the vessel, which must be set so as to promote the gas-phase reactions.

Other quantities independent of the plasma may also be involved, such as the temperature of the substrate on which the layer is deposited, as well as the flow rates of precursor(s) and optionally of carrier gas(es).

Thus, according to the method of the invention, the characteristics of the plasma can be as follows:
 a fixed radio frequency in the range from 13 to 14 MHz, such as a radio frequency of 13.56 MHz;
 a power in the range from 50 to 1000 W;
 a pressure in the range from 1 to 20 torr;
 an electrode gap in the range from 300 to 600 mils.

As for the other characteristics, they can be advantageously as follows:
 a substrate temperature in the range from 100 to 1000° C.;
 a flow of carbon-containing precursor in the range from 50 to 2000 sccm.

Note that sccm denotes a standard cubic centimetre per minute, or 1 $cm^3$/min in standard conditions of temperature and pressure corresponding to a temperature of 0° C. and a pressure of 101 325 Pa (i.e. 1 atm).

These parameters notably make it possible to deposit a layer at a rate of 100 to 1000 Å/cm.

A person skilled in the art will determine, in relation to the carbon-containing precursors and the substrate selected, by simple tests, the plasma characteristics such as to obtain a layer comprising amorphous carbon.

Preferably, the layer comprising amorphous carbon comprises more than 50% of carbon in the $sp^2$ hybridization state.

This proportion of carbon in the $sp^2$ hybridization state can be visualized by means of XPS spectra or Fourier-transform IR spectra.

Once the stage of deposition of the layer has been carried out, according to the invention there is a stage of annealing of the layer under photonic or electronic irradiation, so as to obtain formation of graphene.

This annealing stage can be carried out by heating the previously deposited layer (this means heating by a source external to the irradiation), while submitting it in parallel to irradiation by photons, such as those from a UV light or from a laser, or by electrons, such as an electron beam. This is notably the case when annealing is carried out under UV irradiation.

This annealing stage can also be carried out simply by submitting the layer to the aforementioned irradiation, the heat required for the annealing thus being derived from this irradiation alone. In this case it is not necessary to employ heating by a source external to the irradiation. This can be the case when the annealing is carried out under laser irradiation, the heat necessary for the annealing being supplied by the laser/film interaction, while modulating the power of the beam.

When heating by an external source other than the irradiation is necessary, this can be carried out in a heating vessel or by means of a heating substrate, such as a susceptor, on which the substrate is deposited, covered by the layer comprising amorphous carbon.

Annealing can be carried out at a temperature ranging from room temperature (for example 20° C.) to 1200° C. Such a temperature may be reached with a temperature gradient in the range from 0.1 to 100° C./min for a time that can be in the range from 1 minute to 12 hours.

Annealing can be carried out under high pressure (typically from 1 to 1000 torr) or under ultra-vacuum (typically at a pressure from $10^{-6}$ to 1 torr).

Heating can be carried out in an atmosphere of inert gas, such as $N_2$, rare gases such as He, Ar, Ne, Cr, Xe or in a reducing gas atmosphere (for example, in the presence of hydrogen).

As already mentioned, annealing is carried out under photonic or electronic irradiation.

Preferably, the irradiation to which the layer is submitted is laser irradiation. In this case, the laser used can be an Nd/YAG laser (i.e. a neodymium-doped yttrium-aluminum garnet laser).

Laser irradiation can take the form of laser pulses at a frequency in the range from 1 Hz to 10 kHz for a wavelength in the range from 200 to 600 nm and an energy in the range from 0.1 to 100 $J/cm^2$ for a time from 1 minute to 12 hours.

A person skilled in the art will determine, in relation to the carbon-containing precursors and the substrate selected, by simple tests, the characteristics of the annealing in terms of heating and irradiation for obtaining the layer comprising graphene.

The invention will now be described with reference to the following example, given for purposes of illustration and non-limiting.

DETAILED DESCRIPTION OF PARTICULAR EMBODIMENTS

Example of Application

This example of application comprises two parts:
- a first part, during which a layer of silicon carbide, which serves as a deposition substrate for graphene, is deposited on a silicon plate;
- a second part, during which a layer of graphene is formed on the layer of silicon carbide.

Thus, in the first part, a silicon plate with a diameter of 200 mm is put in a vessel of an LPCVD reactor (that is, a reactor suitable for carrying out low-pressure chemical vapour deposition) so as to permit the deposition of a layer of silicon carbide on the latter by heteroepitaxy.

For this, firstly, oxygen desorption of the reactor is carried out at 1200° C. for 5 minutes with 3 standard litres/minute (SLM) of $H_2$. Then, secondly, the reactor is charged with a mixture of $SiH_4$ (at a flow rate of 0.8 sccm), $C_2H_4$ (at a flow rate of 0.5 sccm) and 3 SLM of $H_2$ for 10 minutes at a temperature of 1100° C. and at a pressure of 200 torr.

In these conditions, a layer of SiC is obtained with a nominal thickness of about 1 μm having an ordered surface morphology (cubic or hexagonal) and a (111) crystal orientation.

According to the second part, the substrate thus obtained is put in a reactor suitable for the PECVD technique of the capacitive radio-frequency type. A thin layer of "a:C—H" amorphous carbon is deposited by PECVD with an $Ar/CH_4$ gas mixture. The thin layer is deposited under a total pressure of 0.3 torr and the total of the gas inflows is 1000 sccm (90% $CH_4$ and 10% Ar). The substrate is heated to a temperature of the order of 550° C. These conditions make it possible to obtain a layer comprising amorphous carbon with a graphitic character (i.e. comprising more than 50% of carbon in the $sp^2$ hybridization state) with an average thickness of 300 nm for deposition taking 30 seconds.

The layer obtained comprises, for the total carbon, 40% of carbon in the $sp^3$ hybridization state and 60% of carbon in the $sp^2$ hybridization state and comprises 30 to 40% of hydrogen. It also has a density in the range from 1.6 to 2.2 $g/cm^3$.

This proportion can be determined by Fourier-transform IR spectroscopy following the $CH_2$ $sp^2$ bonds at 2970 $cm^{-1}$ and at 3025 $cm^{-1}$. It can also be determined by XPS spectroscopy, in which the is carbon line is followed for determining the levels of hybridization. Then the ratio $C\ sp^2/(C\ sp^2 + C\ sp^3)$ is calculated. The carbon in the $sp^2$ hybridization state and the carbon in the $sp^3$ hybridization state appear with a gap of 0.6 to 0.8 eV around the main peak at 285 eV.

The plasma is generated by applying a radio frequency of 13.56 MHz with a power of 300 W.

The substrate covered with the layer comprising amorphous carbon is then placed in a chamber maintained under vacuum by turbomolecular pumping (the pressure in the chamber being $5*10^{-6}$ torr). Pulsed laser radiation (more precisely, an Nd:YAG ablation laser emitting at 532 nm with an energy of 2.33 eV at a frequency of 10 Hz, the pulses having the following characteristics: 7 ns for 15 minutes) is focused on the layer with an angle of incidence of 45° with a spot of 1*5 mm. The radiative energy of the laser is maintained at 7 $J/cm^2$. Exposure of the laser on the layer is accompanied by heating of the substrate carrier, which makes it possible to maintain the specimen temperature at 1100° C. The laser spot is scanned over the surface of the specimen in bands to anneal all of the material. This annealing takes 6 hours.

The Raman spectrum shows a band at 2700 $cm^{-1}$, providing evidence of the presence of graphene.

The invention claimed is:

1. A method of producing a layer comprising graphene on a substrate comprising silicon, the method comprising the following steps:
   - a step of depositing a layer comprising amorphous carbon on said substrate, the amorphous carbon comprising more than 50% of carbon in the $sp^2$ hybridization state; and
   - a step of annealing said layer under photonic or electronic irradiation, whereby said layer comprising graphene on said substrate is obtained.

2. The method according to claim 1, in which the substrate comprising silicon is a substrate of crystalline silicon, a substrate of polysilicon, a substrate of amorphous silicon, a substrate of epitaxial silicon, a substrate of silicon dioxide, a substrate of silicon carbide, a substrate of silicon oxycarbide, a substrate of silicon nitride, a substrate of silicon carbonitride (SiCN), a substrate comprising silicon, oxygen, carbon and fluorine (designated SiOCF), or a substrate of silicon boronitride.

3. The method according to claim 1, in which the substrate is a substrate with a unit cell having a specific orientation (100), (110), (111) or (222).

4. The method according to claim 1, in which the substrate is a substrate of silicon carbide having a specific orientation of the (111) type.

5. The method according to claim 4, in which the substrate is grown epitaxially.

6. The method according to claim 1, in which the step of depositing is carried out by vapour deposition or by wet deposition from at least one carbon-containing precursor.

7. The method according to claim 6, in which, when the step of depositing is carried out by vapour deposition, it is carried out by physical vapour deposition in the vapour phase or by chemical vapour deposition in the vapour phase.

8. The method according to claim 7, in which, when the step of depositing is carried out by chemical vapour deposition, it is carried out by filament-assisted chemical vapour deposition, UV-assisted chemical vapour deposition, cryogenic chemical vapour deposition, or plasma-enhanced chemical vapour deposition.

9. The method according to claim 7, in which the step of depositing is carried out by plasma-enhanced chemical vapour deposition.

10. The method according to claim 6, in which the carbon-containing precursor is selected from alkanes, alkenes, alkynes, diene compounds, aromatic compounds and mixtures thereof.

11. The method according to claim 1, in which the step of annealing is carried out at a temperature in the range 20° C. to 1200° C.

12. The method according to claim 1, in which the photonic irradiation is laser irradiation.

* * * * *